United States Patent
Lee et al.

(10) Patent No.: US 10,082,690 B2
(45) Date of Patent: Sep. 25, 2018

(54) DISPLAY PANEL INCLUDING SEALING MEMBER AT BONDING AREA AND DISPLAY DEVICE INCLUDING THE SAME

(71) Applicant: Samsung Display Co., Ltd., Yongin-si, Gyeonggi-do (KR)

(72) Inventors: Hyo Chul Lee, Cheonan-si (KR); Hyun Seok Hong, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 165 days.

(21) Appl. No.: 15/075,326

(22) Filed: Mar. 21, 2016

(65) Prior Publication Data

US 2017/0086296 A1    Mar. 23, 2017

(30) Foreign Application Priority Data

Sep. 22, 2015  (KR) .................. 10-2015-0133638

(51) Int. Cl.
| | | |
|---|---|---|
| *G02F 1/1345* | (2006.01) | |
| *G02F 1/1333* | (2006.01) | |
| *H05K 1/14* | (2006.01) | |

(52) U.S. Cl.
CPC .... *G02F 1/133305* (2013.01); *G02F 1/13452* (2013.01); *H05K 1/147* (2013.01); *H05K 2201/10128* (2013.01); *H05K 2201/10136* (2013.01)

(58) Field of Classification Search
CPC ............. G02F 1/13452; G02F 1/13454; G02F 2001/13456; G02F 1/13458
See application file for complete search history.

(56) References Cited

U.S. PATENT DOCUMENTS

| | | | |
|---|---|---|---|
| 5,706,069 A | * | 1/1998 | Hermens ........... G02F 1/133351 349/153 |
| 7,897,305 B2 | | 3/2011 | Lee et al. |
| 8,054,395 B2 | | 11/2011 | Lim et al. |
| 2010/0118250 A1 | * | 5/2010 | Fujikawa .............. G02F 1/1345 349/139 |

* cited by examiner

*Primary Examiner* — Phu Vu
(74) *Attorney, Agent, or Firm* — Cantor Colburn LLP

(57) ABSTRACT

A display device includes a first substrate including: a display area in which an image is displayed, and a non-display area in which an image is not displayed and a signal line is disposed to transmit or receive an electrical signal to or from the display area of the first substrate; a second substrate coupled to the first substrate and exposing the non-display area of the first substrate; and a sealing member which is disposed between the first substrate and the second substrate and couples the first substrate and the second substrate to each other. The sealing member between the first substrate and the second substrate extends to overlap the signal line in the exposed non-display area of the first substrate.

19 Claims, 8 Drawing Sheets

DISPLAY PANEL INCLUDING SEALING MEMBER AT BONDING AREA AND DISPLAY DEVICE INCLUDING THE SAME

This application claims priority to Korean Patent Application No. 10-2015-0133638 filed on Sep. 22, 2015 and all the benefits accruing therefrom under 35 U.S.C. § 119, the contents of which in their entirety are herein incorporated by reference.

BACKGROUND

1. Field

The invention relates to a display device, and more particularly, to a frameless display device.

2. Description of the Related Art

Display devices are means for visually displaying data. Display devices may include liquid crystal displays, electrophoretic displays, organic light emitting displays, inorganic electroluminescent ("EL") displays, field emission displays, surface-conduction electron-emitter displays, plasma displays, cathode ray displays and the like.

A typical display device is provided with a separate component such as a top chassis for covering a bonding area where a display panel and a driver integrated circuit (IC) are interconnected.

SUMMARY

An embodiment of the invention provides a display device having a frameless structure, in which a bonding area at which a display panel and a driver integrated circuit ("IC") are interconnected are covered.

In an exemplary embodiment of the invention, there is provided a display device including: a first substrate including a display area in which an image is displayed, and a non-display area in which an image is not displayed and a signal line is disposed to transmit or receive an electrical signal to or from the display area of the first substrate; a second substrate coupled to the first substrate and exposing the non-display area of the first substrate; and a sealing member which is disposed between the first substrate and the second substrate and couples the first substrate and the second substrate to each other. The sealing member between the first substrate and the second substrate extends to overlap the signal line in the exposed non-display area of the first substrate.

The extended sealing member disposed overlapping the signal line in the exposed non-display area of the first substrate may define a bar shape or a convex shape provided in plural.

The display device may further include a spacer substrate disposed in the exposed non-display area of the first substrate; and a polarizer extended to overlap the second substrate and the spacer substrate. An entirety of the polarizer is exposed to outside the display device to define the display device as a frameless display device.

The extended sealing member may be disposed overlapping the spacer substrate.

The sealing member may include an opaque material.

The display device may further include: a flexible circuit substrate disposed in the exposed non-display area of the first substrate and electrically connected to the signal line in the exposed non-display area of the first substrate; and a driver integrated circuit on the flexible circuit substrate.

The display device may further include: a driver integrated circuit disposed in the exposed non-display area of the first substrate and electrically connected to the signal line disposed in the exposed non-display area the first substrate; and a flexible circuit substrate electrically connected to the driver integrated circuit.

In another exemplary embodiment of the invention, there is provided a display device including: a first substrate including a display area and a non-display area; a second substrate coupled to the first substrate and exposing the non-display area of the first substrate; a sealing member which is disposed between the first substrate and the second substrate and couples the first substrate and the second substrate to each other; and a flexible circuit substrate electrically connected to the first substrate at the exposed non-display area of the first substrate. The sealing member between the first substrate and the second substrate extends to overlap the flexible circuit substrate at the exposed non-display area of the first substrate.

A signal line may be disposed in the exposed non-display area of the first substrate and transmits or receives an electrical signal to or from the display area of the first substrate.

The extended sealing member may be disposed overlapping the signal line in the exposed non-display area of the first substrate.

The flexible circuit substrate electrically connected to the first substrate at the exposed non-display area of the first substrate may include a driver integrated circuit.

In the exposed non-display area of the first substrate, a first portion of the extended sealing member may not overlap the flexible circuit substrate and a second portion of the extended sealing member may overlap the flexible circuit substrate. The first portion may define a thickness of the extended sealing member applied larger than that of the second portion of the extended sealing member.

The extended sealing member overlapping the flexible circuit substrate in the exposed non-display area of the first substrate may define a bar shape or a convex shape provided in plural.

The display device may further include a spacer substrate disposed on the non-display area of the first substrate and the flexible circuit substrate; and a polarizer disposed on the spacer substrate and the second substrate. An entirety of the polarizer may be exposed to outside the display device to define the display device as a frameless display device.

The extended sealing member may be disposed overlapping the spacer substrate.

The sealing member may include an opaque material.

BRIEF DESCRIPTION OF THE DRAWINGS

The above and other objects, features and advantages of the invention will be more apparent from the following detailed description taken in conjunction with the accompanying drawings, in which.

DETAILED DESCRIPTION

Figure 1:
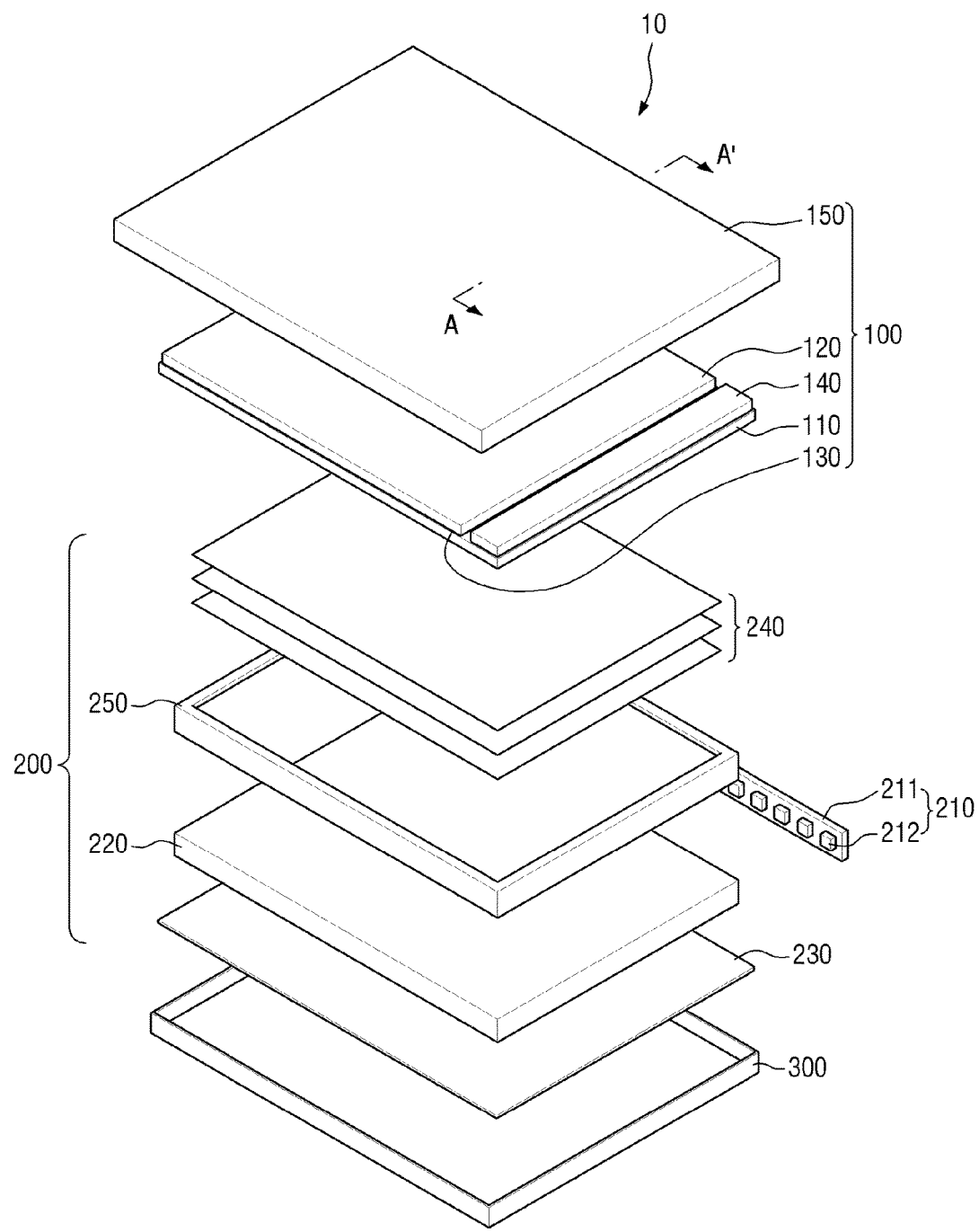
FIG. 1 is an exploded perspective view schematically illustrating an exemplary embodiment of a display device according to the invention.

Advantages and features of the invention and methods of accomplishing the same may be understood more readily by reference to the following detailed description of exemplary embodiments and the accompanying drawings. The invention may, however, be embodied in many different forms and should not be construed as being limited to the exemplary embodiments set forth herein. Rather, these exemplary embodiments are provided so that this disclosure will be thorough and complete and will fully convey the invention to those skilled in the art, and the invention will only be defined by the appended claims.

It will also be understood that when a layer is referred to as being "on" another layer or substrate, it can be directly on the other layer or substrate, or intervening layers may also be present. The same reference numbers indicate the same components throughout the specification. In contrast, when an element is referred to as being "directly on" another element, there are no intervening elements present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Among elements of a display device, a separate component such as a top chassis may be employed for covering a bonding area where a display panel and a driver integrated circuit ("IC") are interconnected. However, such a separate component undesirably causes an increase in the width of a bezel area of the display device. A frameless structure display device in which a separate component such as a top chassis is omitted to reduce a bezel area has been proposed.

Embodiments of the present invention will now be described with reference to the drawings.

Figure 2:
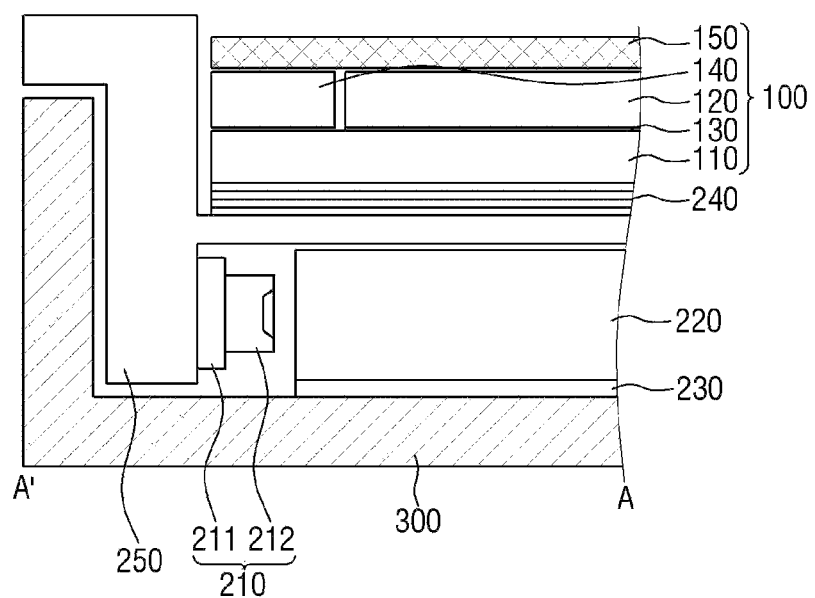
FIG. 2 is a cross sectional view taken along line A-A' of FIG. 1.

FIG. 1 is an exploded perspective view schematically illustrating an exemplary embodiment of a display device according to the invention, and FIG. 2 is a cross sectional view taken along line A-A' of FIG. 1.

Referring to FIG. 1 and FIG. 2, an exemplary embodiment of a display device 10 according to the invention includes a display panel unit 100, a backlight unit 200 and a bottom chassis 300.

The display panel unit 100 may display an image, and may be a liquid crystal display ("LCD") panel, an electrophoretic display panel, an organic light emitting diode ("OLED") panel, a light emitting diode ("LED") panel, an inorganic electroluminescent ("EL") display panel, a field emission display ("FED") panel, a surface-conduction electron-emitter display ("SED") panel, a plasma display panel or a cathode ray tube ("CRT") display panel. The display device 10 will hereinafter be described as a liquid crystal display, but the display device and the display panel unit 100 according to the invention are not limited thereto, and various types of display devices and display panel units 100 may be employed.

The display panel unit 100 may include a first display substrate 110, a second display substrate 120 spaced apart from the first display substrate 110, and an optical conversion layer such as a liquid crystal layer 130 interposed between the first display substrate 110 and the second display substrate 120.

The first display substrate 110 and the second display substrate 120 may have different sizes. That is, the size of the first display substrate 110 may be larger than that of the second display substrate 120, such as in a top plan view of the display device 10. Thus, a plurality of signal lines and a bonding area at which components of the display device are connected, may defined on one surface of the first display substrate 110, that is, the surface of the first display substrate 110 which does not face the second display substrate 120. A driver IC for controlling driving of the first display substrate 110 and the second display substrate 120 and/or to a flexible circuit substrate may be disposed on the one surface of the first display substrate 110, that is, the surface of the first display substrate 110 which does not face the second display substrate 120.

The display device 10 according to the invention may be a four side frameless display device with minimized bezel area. The display device 10 may further include a spacer substrate 140 and a polarizer 150 for realizing the four side frameless display device. For purpose of description, the spacer substrate 140 and/or the polarizer 150 may be included in the display panel unit 100.

The spacer substrate 140 may be interposed between a lower surface of the polarizer 150 and an upper surface of the first display substrate 110. The spacer substrate 140 may serve to fix the polarizer 150 at position within the display device 10 and fill a stepped portion defined by the second display substrate 120 interposed between the first display substrate 110 and the polarizer 150.

The polarizer 150 may be disposed on upper surfaces of the second display substrate 120 and the spacer substrate 140 so as to minimize or effectively prevent reduction of a contrast ratio caused mixture of light which is incident from an external source into the display panel unit 100 and reflected and light generated from liquid crystal molecules of the liquid crystal layer 130. Since the display device 10 according to the invention is frameless, a planar size of the polarizer 150 may be maximized such as to correspond to the planar size of the first display substrate 110. That is the planar sizes of the polarizer 150 and the first display substrate 110 may be substantially the same as each other, and an entirety of the polarizer 150 disposed on the display panel unit 100 is exposed.

In general, a window substrate (not shown) including a light blocking area such as a black area printed with a black material may further be disposed in a region on the display panel unit corresponding to the signal lines and the bonding area so as to cover the signal lines and the bonding area disposed on the first display substrate.

However, when a conventional display device includes a window substrate, a cost of the display device is undesirably increased. Thus, in one or more exemplary embodiment of the display device 10 according to the invention, a window substrate may be omitted from a configuration thereof so as to avoid the problem of increasing a cost thereof. In one or more exemplary embodiment of the display device 10 according to the invention, the signal lines and the bonding area which may be exposed outwardly when the window substrate is omitted may be instead covered by expanding or extending a sealing member such as a sealant used in bonding the first display substrate 110 and the second display substrate 120 to the signal lines and the bonding area. This will be described in more detail later with reference to FIG. 3 to FIG. 5.

The backlight unit 200 may be disposed below the display panel unit 100 so as to generate and provide light to the display panel unit 100. The backlight unit 200 may include a light source unit 210 which generates light, a light guide plate 220, a reflector plate 230, optical sheets 240 and a mold frame 250.

The light source unit 210 may generate light and irradiate the generated light to the light guide plate 220. The light source unit 210 may be disposed to correspond to one side surface of the light guide plate 220, that is, a light incident surface of the light guide plate 220.

The light source 210 may include a circuit substrate 211 and a light source 212 provided in plural on the circuit substrate 211.

The circuit substrate 211 may be disposed to correspond to the light incident surface of the light guide plate 220. The circuit substrate 211 may be connected to a power source (not shown) so as to transmit electrical energy provided from the power source to the light sources 212.

The plurality of light sources 212 may be disposed on one surface of the circuit substrate 211, and the light sources 212 may be spaced apart from each other at a predetermined spacing along a length of the circuit substrate 211. The plurality of light sources 212 may convert the electrical energy transmitted through the circuit substrate 211 into optical energy. The plurality of light sources 212 may be light emitting diodes ("LEDs") and may emit blue light. In an exemplary embodiment, the light sources 212 are described as emitting blue light, but the invention is not limited thereto.

In the exemplary embodiment described with reference to FIG. 1 and FIG. 2, one surface of the circuit substrate 211 contacting the light sources 212 is illustrated as being parallel to the light incident surface of the light guide plate 220, but the invention is not limited thereto, and the one surface of the circuit substrate 211 may be disposed vertically (e.g., perpendicular) to the light incident surface of the light guide plate 220.

In an exemplary embodiment of the invention, the light source unit 210 is described as being disposed at a side portion of the light guide plate 220 so as to form a side emitting structure, but the invention is not limited thereto. Furthermore, a separate reflecting film may further be disposed on the light sources 212 so as to guide light emitted from the light sources 212 when the display device 10 has the side emitting structure described in an exemplary embodiment of the invention.

The light guide plate 220 may guide light emitted from the light source unit 210 so as to transfer the light to the display panel unit 100. The light guide plate 220 may be disposed at a side portion of the light source unit 210 as described above. That is, the light guide plate 220 and the light source unit 210 may be disposed in the substantially same plane within a cross-sectional thickness direction of the display device 10.

The light guide plate 220 made include or be made of a transparent material. In an exemplary embodiment, the light guide plate 220 may include or be made of polymethylmethacrylate ("PMMA"), but the invention is not limited thereto, and the light guide plate 220 may be made of various transparent materials capable of guiding light. Furthermore, the light guide plate 220 may include or be made of a relatively rigid material, but the invention is not limited thereto, and the light guide plate 220 may include or be made of a flexible material. Although the light guide plate 220 is depicted as having a rectangular parallelepiped shape in FIG. 1, the invention is not limited thereto, and the light guide plate 220 may have various shapes.

The reflector plate 230 may be disposed beneath the light guide plate 220. The reflector plate 230 may change a path of light which is emitted from the light source unit 210 and proceeds toward a lower surface of the light guide plate 220. The reflector plate 230 may include or be made of a reflective material, for example, a metal material.

The optical sheets 240 may be disposed on an upper surface of the light guide plate 220 so as to diffuse and condense light emitted from the light guide plate 220. The optical sheets 240 may include an individual sheet provided in plural, and the plurality of optical sheets 240 may be stacked to be overlapped with each other to supplement functions of one another. In an exemplary embodiment, for example, the plurality of optical sheets 240 may include a prism sheet, a diffusion sheet, a protective sheet and the like. More specifically, the prism sheet may include triangular prisms uniformly arranged on one surface thereof so as to condense light diffused from the diffusion sheet in a direction vertical (e.g., perpendicular) to the display panel unit 100. The diffusion sheet may be interposed between the light guide plate 220 and the prism sheet so as to diffuse the light incident from the light guide plate 220 such that the light may not be partially concentrated. The protective sheet may be disposed on the prism sheet so as to protect the surface of the prism sheet and diffuse light, making the distribution of light uniform. The plurality of optical sheets 240 may be accommodated and fixed in the mold frame 250. The display panel unit 100 may be disposed on the optical sheet 240.

The mold frame 250 may be disposed beneath the plurality of optical sheets 240 so as to accommodate and fix the plurality of optical sheets 240 and the display panel unit 100 therein. Although the mold frame 250 is depicted as being placed beneath the plurality of optical sheets 240 in FIG. 1 and FIG. 2, the invention is not limited thereto, and the mold frame 250 may be placed on the plurality of optical sheets 240, that is, between the plurality of optical sheets 240 and the display panel unit 100.

The bottom chassis 300 may accommodate the display panel unit 100 and the backlight unit 200 therein. The bottom chassis 300 may include or be made of a conductive material, for example, metal.

Figure 3:
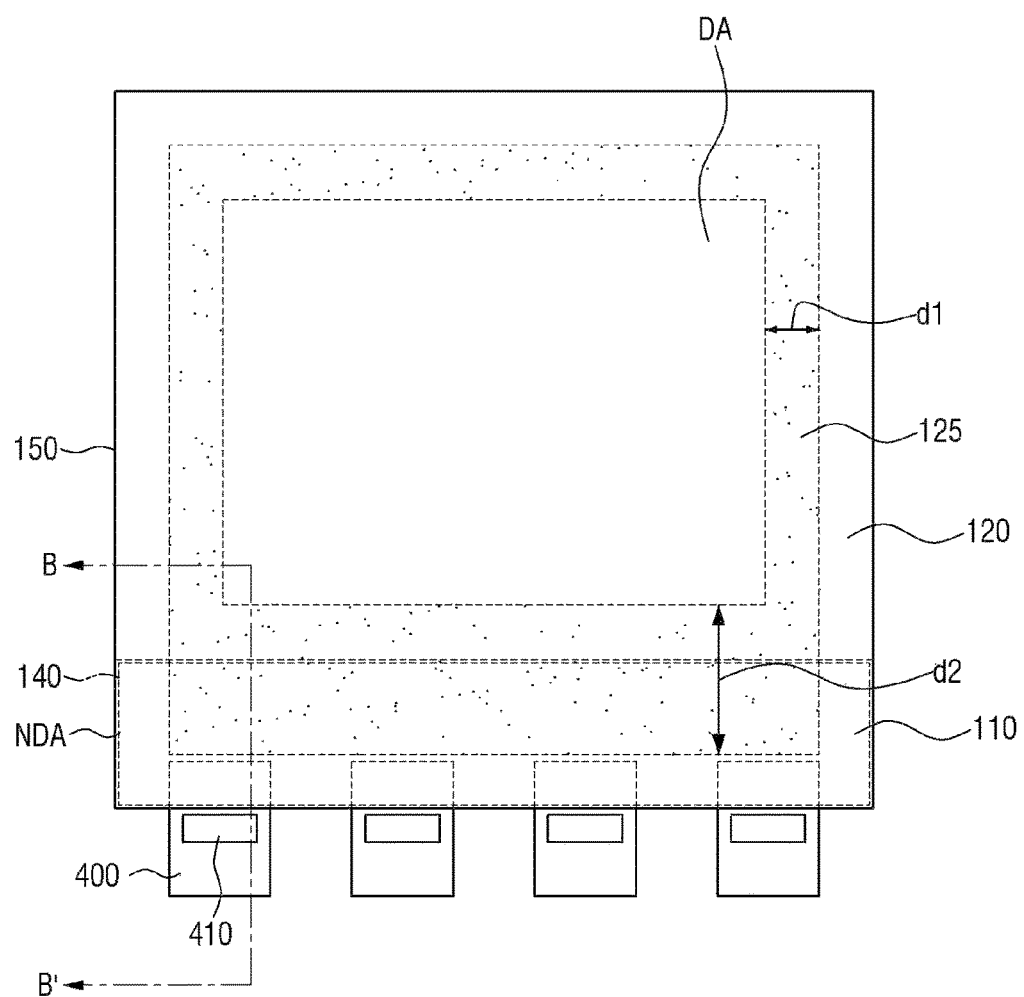
FIG. 3 is a top plan view schematically illustrating an exemplary embodiment of a shape of a sealing member with respect to components of a display panel unit of a display device according to the invention.
Figure 4:
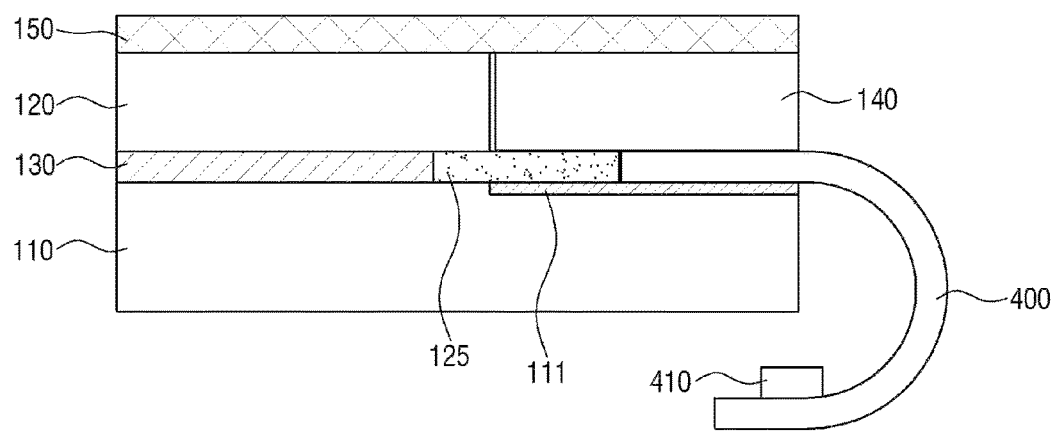
FIG. 4 is a cross sectional view taken along line B-B' of FIG. 3.
Figure 5:
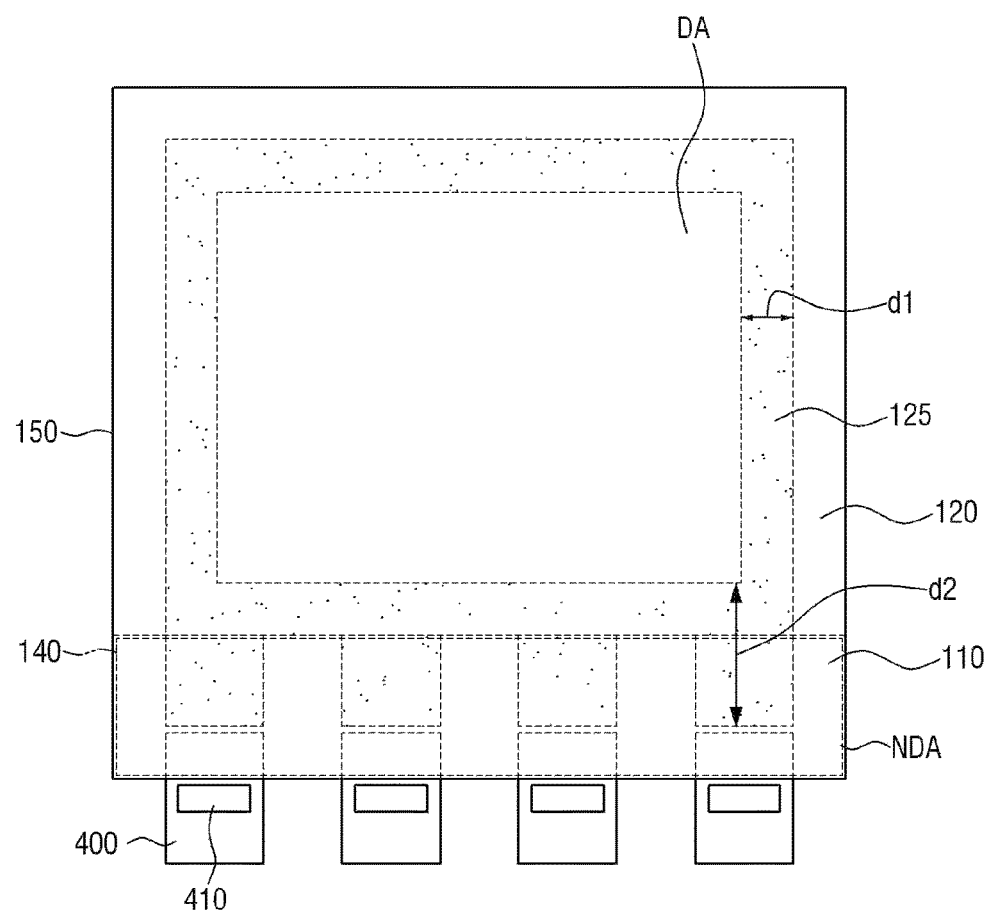
FIG. 5 is a top view schematically illustrating another exemplary embodiment of a shape of a sealing member with respect to components of a display panel unit of a display device according to the invention.

FIG. 3 is a top view schematically illustrating an exemplary embodiment of a shape of a sealing member with respect to components of a display panel unit of a display device according to the invention, FIG. 4 is a cross sectional view taken along line B-B' of FIG. 3, and FIG. 5 is a top view schematically illustrating another exemplary embodiment of a shape of a sealing member with respect to components of a display panel unit of a display device according to the invention.

Referring to FIG. 3 to FIG. 5, the display panel unit 100 according to the invention may include the first display substrate 110, the second display substrate 120, the liquid crystal layer 130, the spacer substrate 140 and the polarizer 150 as aforementioned. Furthermore, an exemplary embodiment of the display device 10 according to the invention may further include a flexible circuit substrate 400 including a driver IC 410 for controlling driving of the display panel unit 100. The flexible circuit substrate 400 may be provided in plural along a side of the display panel unit 100.

The first display substrate 110 may include or be made of a transparent insulating material. The transparent insulating material may be, for example, glass, quartz, ceramic, plastic or the like. The first display substrate 110 may have a flat panel shape and may include be made of a flexible material easily bendable by force applied from an external source. On a base substrate thereof, the first display substrate 110 may include a display area DA at which an image is displayed and a non-display area NDA at which an image is not displayed. The second display substrate 120 may include a display area and a non-display area corresponding to those of the first display substrate 110. The non-display area NDA may exclude the display area DA, but the invention is not limited thereto.

A plurality of switching elements (for example, thin film transistors), various wirings and electrodes may be arranged in the display area DA of the first display substrate 110. The switching elements and wirings may define a pixel region of the display area DA, but the invention is not limited thereto. More specifically, the first display substrate 110 may include a gate line provided in plural each lengthwise extended in one direction and a data line provided in plural and lengthwise extended to intersect the plurality of gate lines. In one exemplary embodiment, pixel regions within the display area DA may be defined by the gate lines and the data lines intersecting each other, but the invention is not limited thereto.

In an exemplary embodiment, each pixel region may include a switching element and a pixel electrode disposed therein. The switching element, a thin film transistor for example, may include a gate electrode connected to the gate line, a semiconductor layer disposed on the gate electrode, and a source electrode and a drain electrode disposed on the semiconductor layer and electrically connected to the data line and the pixel electrode. The switching element may supply, when a gate signal is applied, a data voltage provided from the data line to the pixel electrode in response to the gate signal.

Referring to FIGS. 3 and 4, a signal line 111 may be disposed in plural in the non-display area NDA of the first display substrate 110 The signal lines 111 may be connected to the plurality of gate lines and data lines disposed in the display area DA, so as to transmit an electrical signal from the flexible circuit substrate 400 to the display area DA and transmit an electrical signal to the flexible circuit substrate 400 from the display area DA.

The second display substrate 120 may include or be made of a transparent insulating material. The transparent insulating material may be, for example, glass, quartz, ceramic, plastic or the like. The second display substrate 120 may have a flat panel shape and may include or be made of a flexible material easily bendable by force applied from an external source. On a base substrate thereof, the second display substrate 120 may include color filters for expressing red, green and blue colors, a black matrix for dividing pixel regions, and a common electrode facing the pixel electrode disposed on the first display substrate 110 and cooperating with the pixel electrode so as to generate an electric field for aligning liquid crystal molecules in the liquid crystal layer 130. The invention is not limited thereto, and one or more of the color filters, the black matrix and the common electrode may be disposed in the first display substrate 110.

The flexible circuit substrate 400 may serve to receive data and a control signal applied from an external source outside of the display panel unit 100, and transfer the data and the control signal to the display panel unit 100. The flexible circuit substrate 400 may include or be made of a polyimide ("PI") material, and include the driver IC 410 mounted in an open area thereof. The structure in which the driver IC 410 is mounted on the flexible circuit substrate 400 is referred to as a chip on film ("COF"). The flexible circuit substrate 400 may be bonded to the non-display area NDA of the display panel unit 100 so as to be electrically connected to the signal lines 111.

The first display substrate 110 of the display panel unit 100 may be bonded to the second display substrate 120 by a sealing member 125 such as a sealant disposed along an edge of the display area DA. The sealing member 125 may include be made of a material including a frit or resin component including fine glass particles. In an exemplary embodiment, the sealing member 125 includes or is made of an opaque material so as to reduce or effectively prevent exposure of the signal lines 111 disposed in the non-display area NDA of the first display substrate 110 to outside the display panel unit 100. In an exemplary embodiment of manufacturing the display device 10, the sealing member 125 at a gel or paste state may be applied along an edge of the display area DA of the first display substrate 110 and irradiated with a laser beam so as to be changed to a molten state by the energy of the laser beam, and may then be hardened.

An exemplary embodiment of the sealing member 125 of the display device 10 according to the invention may be expansively applied to a certain region of the non-display area NDA of the first display substrate 110 as shown in FIG. 3 to FIG. 5. More specifically, among the four sides of the display panel unit 100 in the top plan view, a width d2 of the sealing member 125 applied onto a portion of the non-display area NDA of the first display substrate 110 exposed due to a size difference between the first display substrate 110 and the second display substrate 120 may be greater than a width d1 of the sealing member 125 applied onto a portion where the first display substrate 110 and the second display substrate 120 are overlapped with each other. The width d2 being larger than the width d1 reduces or effectively prevents the signal lines 111 electrically connected to the flexible circuit substrate 400 in the non-display area NDA of the first display substrate 110 from being exposed outwardly.

The sealing member 125 defines portions thereof lengthwise extended along the sides of the display panel unit 100. A width of a portion of the sealing member 125 is taken perpendicular to a lengthwise extension thereof. A portion of the sealing member 125 disposed at the area where the first display substrate 110 and the second display substrate 120 are overlapped with each other may be extended to the non-display area NDA.

Furthermore, since the sealing member 125 may be expansively applied from the area where the first display substrate 110 and the second display substrate 120 are overlapped with each other to a certain region of the non-display area NDA of the first display substrate 110, the sealing member 125 may be overlapped with a portion of the spacer substrate 140. The certain region as used herein may be a region where the signal lines 111 disposed in the non-display area NDA of the first display substrate 110 would be exposed, that is, a region from an end of the second display substrate 120 to one end of the flexible circuit substrate 400. The sealing member 125 which is thus overlapped with the portion of the spacer substrate 140 may further stabilize the spacer substrate 140 within the display panel unit 100.

The sealing member 125 extended from the area where the first display substrate 110 and the second display substrate 120 are overlapped with each other to the non-display area NDA of the first display substrate 110 may have, for example, a bar shape as shown in FIG. 4. The bar shape indicates a continuous member lengthwise extended along the side of the display panel unit 100 at which the flexible circuit substrate 400 is disposed. Alternatively, the sealing member 125 may be extended from the area where the first display substrate 110 and the second display substrate 120 are overlapped with each other to the non-display area NDA of the first display substrate 110 to be widely formed only in the regions where the signal lines 111 are disposed, and thus be formed into, for example, a shape including a convex portion at an end of the first display substrate 110 as shown in FIG. 5. That is, different from the bar shape described above, FIG. 5 illustrates the sealing member 125 in the non-display area NDA as a non-continuous member along the side of the display panel unit 100 at which the flexible circuit substrate 400 is disposed FIG. 6 is a top view schematically illustrating another exemplary embodiment of a display panel unit according to the invention, and FIG. 7 is a cross sectional view taken along line C-C' of FIG. 6.

Figure 6:
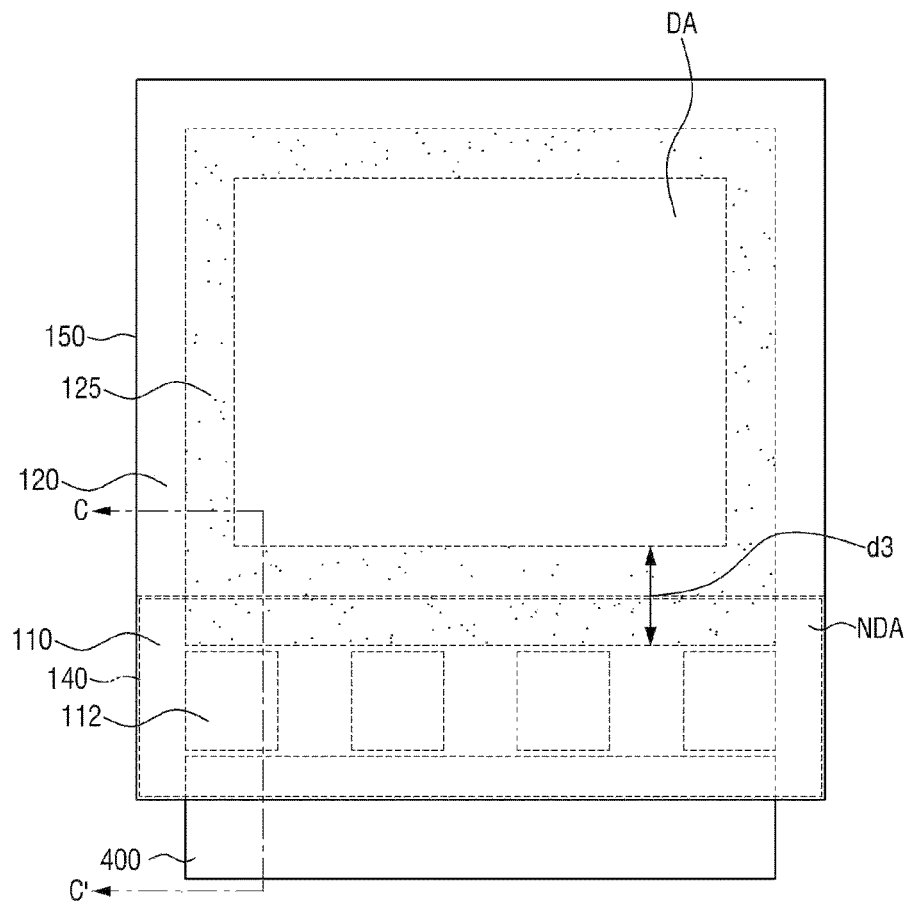
FIG. 6 is a top view schematically illustrating another exemplary embodiment of a display panel unit of a display device according to the invention.
Figure 7:
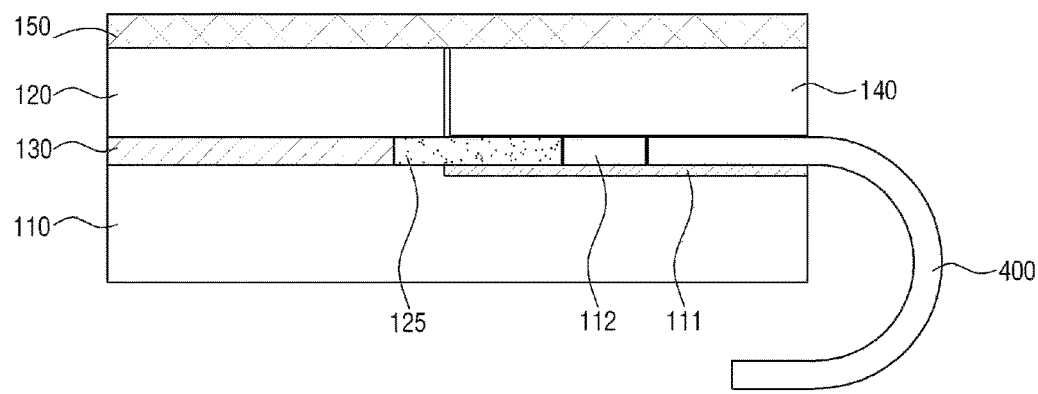
FIG. 7 is a cross sectional view taken along line C-C' of FIG. 6.

Referring to FIG. 6 and FIG. 7, the display panel unit according to the invention may include the first display substrate 110, the second display substrate 120, the liquid crystal layer 130 interposed between the first display substrate 110 and the second display substrate 120, the spacer substrate 140 disposed on the non-display area NDA of the first display substrate 110, and the polarizer 150 disposed on the second display substrate 120 and the spacer substrate 140. As including these components, the display panel unit shown in FIG. 6 and FIG. 7 may be similar to the display panel unit shown in FIG. 3 to FIG. 5, except that a driver IC 112 may be disposed on the non-display area NDA of the first display substrate 110 rather than being provided to the flexible circuit substrate 400. This structure is referred to as a chip on glass ("COG"). Thus, description of FIG. 6 and FIG. 7 will be made mainly on differences from those made with reference to FIGS. 3 to 5.

The driver IC 112 disposed on the non-display area NDA of the first display substrate 110 may have a first end electrically connected to the signal lines 111 disposed on the first display substrate 110 and a second end opposite to the first end thereof electrically connected to the flexible circuit substrate 400. The flexible circuit substrate 400 may be provided in singular, but the invention is not limited thereto.

The sealing member 125 shown in FIG. 6 and FIG. 7 may be expansively applied from the area where the first display substrate 110 and the second display substrate 120 are overlapped with each other to a certain region of the non-display area NDA of the first display substrate 110. Since the driver IC 112 may be disposed on the first display substrate 110, a width d3 of the sealing member 125 disposed in the non-display area NDA of the first display substrate 110 may be smaller than the width d2 of the sealing member 125 shown in FIG. 3 to FIG. 5. Although not shown in the drawings, the sealing member 125 may be disposed or formed only in the regions where the signal lines 111 are disposed so as to reduced or effectively prevent the signal lines 111 connected to the driver IC 112 from being exposed outwardly, and thus the sealing member 125 may have a shape including a convex portion as shown in FIG. 5.

Figure 8:
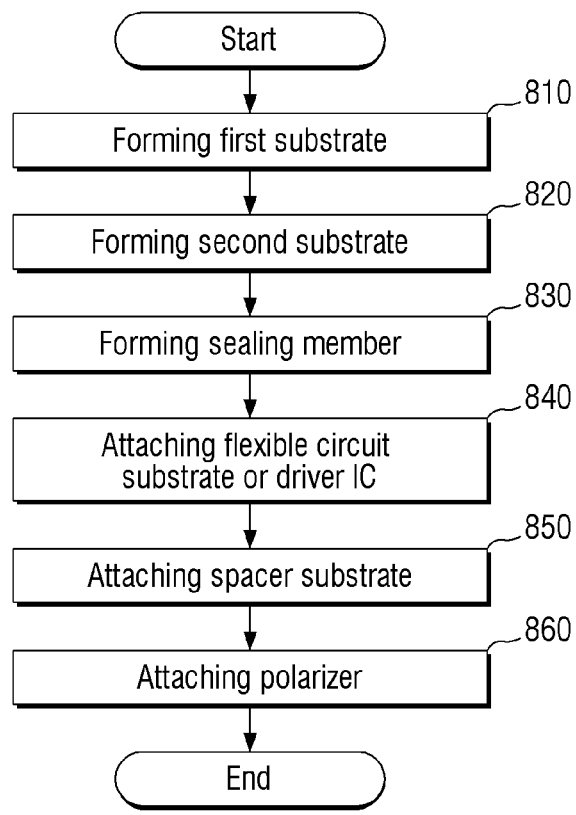
FIG. 8 is a flowchart schematically illustrating processes of an exemplary embodiment of forming a display panel unit of a display device according to the invention.

FIG. 8 is a flowchart schematically illustrating processes of an exemplary embodiment of forming a display panel unit of a display device according to the invention.

Referring to FIG. 8, to form an exemplary embodiment of the display device 10 including the display panel unit 100 according to the invention, the first display substrate 110 may be formed (810) and the second display substrate 120 may be formed (820). Although the first display substrate 110 is illustrated as being formed prior to the second display substrate 120 in FIG. 8, the invention is not limited thereto, and the second display substrate 120 may be formed first, or the first display substrate 110 and the second display substrate 120 may be simultaneously formed.

The sealing member 125 may be formed along an edge of the first display substrate 110 and extended to a certain region of the non-display area NDA of the first display substrate 110 so as to reduce or effectively prevent the signal lines 111 disposed in the non-display area NDA of the first display substrate 110 from being exposed (830). The first display substrate 110 and the second display substrate 120 may be bonded with each other by the sealing member 125.

The flexible circuit substrate 400 or the driver IC 112 may be attached onto the first display substrate 110 (840), and the spacer substrate 140 may be disposed on the flexible circuit substrate 400 or the driver IC 112 (850). Further, the flexible circuit substrate 400 and the driver IC 112 may be attached onto the first display substrate 110 through an anisotropic conductive film (not shown).

The polarizer 150 may be disposed on the second display substrate 120 and the spacer substrate 140 (860), thereby completing the display panel unit of the display device according to the invention.

As described above, the sealing member 125 may be expansively formed from the area where the first display substrate 110 and the second display substrate 120 are overlapped with each other to correspond to the signal lines 111 region of the non-display area NDA of the first display substrate 110. That is, the sealing member 125 may terminate at a position corresponding to the signal lines 111 but not overlapping with the flexible circuit substrate 400. However, in an exemplary embodiment, the sealing member 125 may be extended further than the signal lines 111 to overlap even a larger portion of the non-display area NDA of the first display substrate 110 so as to further stabilize the spacer substrate 140. That is, the sealing member 125 may terminate at a position which overlaps the flexible circuit substrate 400.

Figure 9:
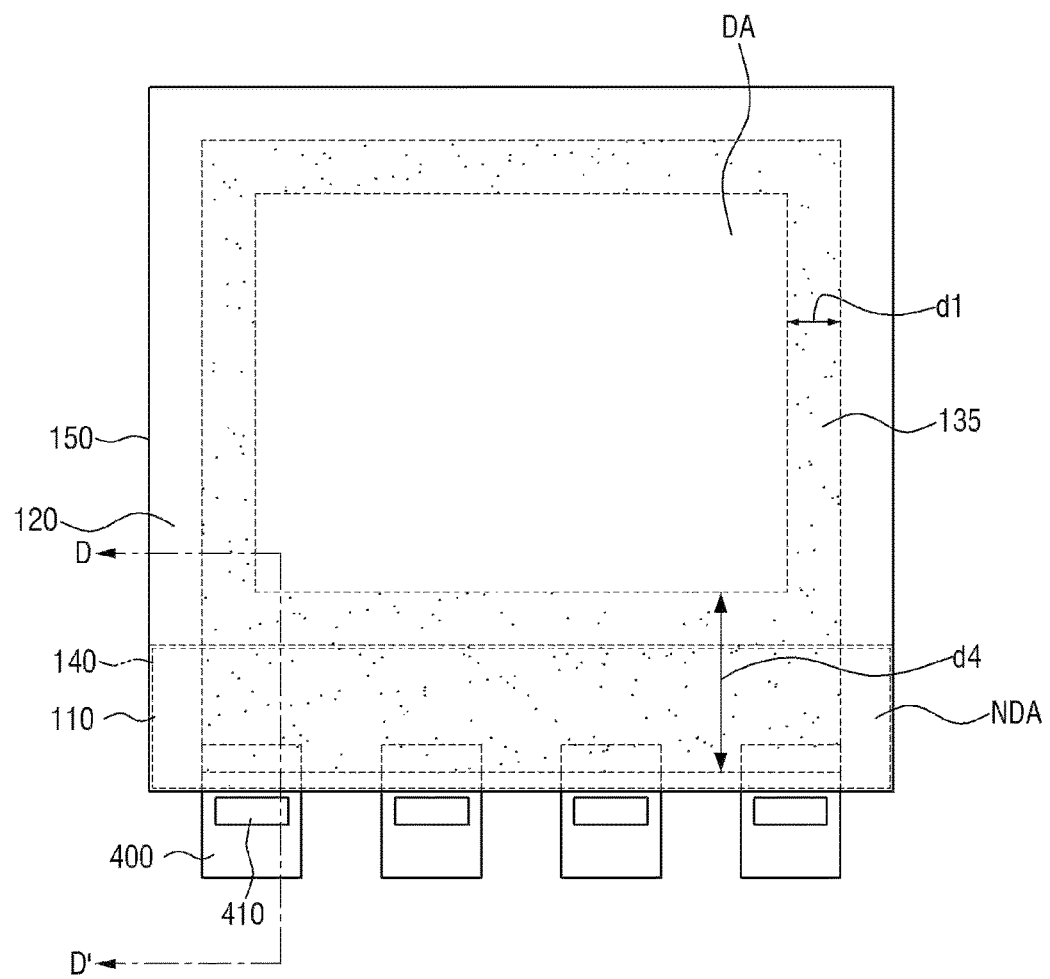
FIG. 9 is a top view schematically illustrating still another exemplary embodiment of a display panel unit of a display device according to the invention.
Figure 10:
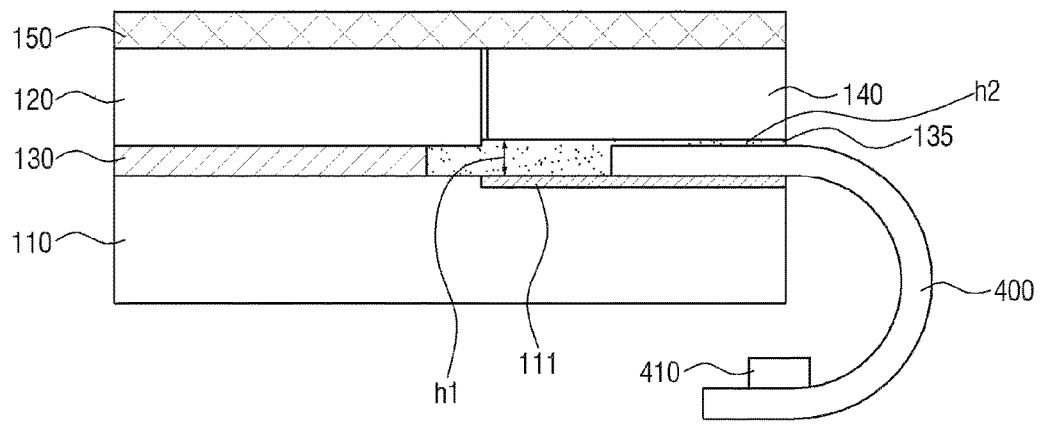
FIG. 10 is a cross sectional view taken along line D-D' of FIG. 9.

FIG. 9 is a top view schematically illustrating still another exemplary embodiment of a display panel unit of a display device according to the invention. FIG. 10 is a cross sectional view taken along line D-D' of FIG. 9.

The display panel unit according to the invention in FIG. 9 and FIG. 10 is exemplified as having a chip on film ("COF") structure in which a driver IC is provided as shown in FIG. 3 to FIG. 5, and other components in the embodiment described with reference to FIG. 9 and FIG. 10 are also similar to those described with reference to FIG. 3 and FIG. 5. However, in FIG. 9 and FIG. 10, a sealing member 135 may be applied over a range different from those of aforementioned embodiments, which may cause a difference in manufacturing methods thereof. Descriptions will hereinafter be made mainly on the differences.

Referring to FIG. 9 and FIG. 10, the sealing member 135 may be disposed or formed along an edge of the first display substrate 110 so as to bond the first display substrate 110 and the second display substrate 120 with each other, and may extend all over the whole surface of the non-display area NDA of the first display substrate 110. In other words, a width d4 of the sealing member 135 applied to the non-display area NDA of the first display substrate 110 shown in FIG. 9 and FIG. 10 may be greater than the width d2 of the sealing member 125 applied to the non-display area NDA of the first display substrate 110 shown in FIG. 3 to FIG. 5. More specifically, the sealing member 135 may be applied to a region in which the first display substrate 110 and the second display substrate 120 are bonded and overlapped with each other, applied to a bonding area in which the signal lines 111 on the first display substrate 110 and the flexible circuit substrate 400 are electrically interconnected with each other, and applied onto the flexible circuit substrate 400 to overlap the flexible circuit substrate 400.

Where the sealing member 135 is extended from the area where the first display substrate 110 and the second display substrate 120 are overlapped with each other to overlap the flexible circuit substrate 400, a thickness h1 of the sealing member 135 at a portion of the signal lines 111 excluding the flexible circuit substrate 400 disposed on the first display substrate 110 may be greater than a thickness h2 of the sealing member 135 disposed overlapping the flexible circuit substrate 400. In an exemplary embodiment, the sealing member 135 which extends to overlap the flexible circuit substrate 400 does not extend further than an edge of the first display substrate 110. Furthermore, in an exemplary embodiment, the sealing member 135 is applied not to contact the driver IC 410 disposed in an open area of the flexible circuit substrate 400.

Thus-applied sealing member 135 may have a bar shape as shown in FIG. 10 taken with FIG. 9. However, the invention is not limited thereto, and the sealing member 135 may have a shape including a convex portion as in the embodiment described with reference to FIG. 5.

As described above, since the sealing member 135 may also be applied onto the flexible circuit substrate 400, a manufacturing method may also be slightly different from those described above with reference to FIG. 8.

Figure 11:
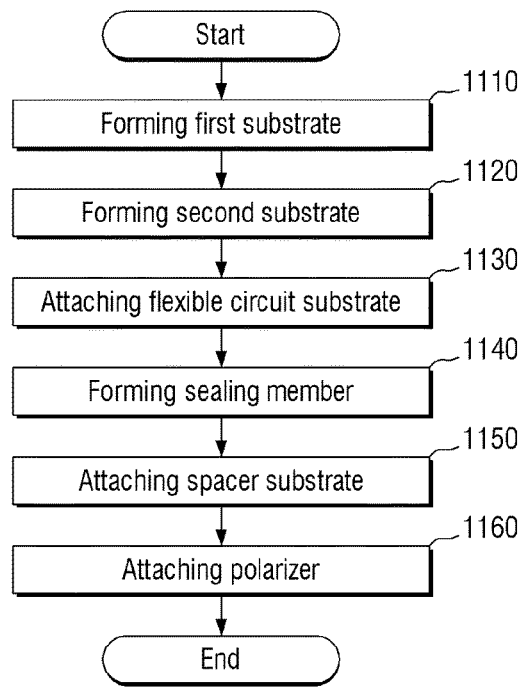
FIG. 11 is a flowchart schematically illustrating processes of another exemplary embodiment of forming the display panel unit of a display device according to the invention.

FIG. 11 is a flowchart schematically illustrating processes of another exemplary embodiment for forming the display panel unit of a display device according to the invention.

Referring to FIG. 11, to form another exemplary embodiment of the display device 10 including the display panel unit 100 according to the invention, the first display substrate 110 may be formed (1110) and the second display substrate 120 may be formed (1120). Although the first display substrate 110 is illustrated as being formed prior to the second display substrate 120 in FIG. 11, the invention is not limited thereto, and the second display substrate 120 may be formed first, or the first display substrate 110 and the second display substrate 120 may be simultaneously formed.

The flexible circuit substrate 400 may be attached onto the first display substrate 110 (1130). The flexible circuit substrate 400 may be attached onto the first display substrate 110 through an anisotropic conductive film (not shown).

The sealing member 135 may be formed along an edge of the first display substrate 110 in such a manner that the sealing member 135 extends from the area where the first display substrate 110 and the second display substrate 120 are overlapped with each other onto an upper surface of the flexible circuit substrate 400 attached onto the non-display area NDA of the first display substrate 110 (1140). The first display substrate 110 and the second display substrate 120 may be bonded with each other by the sealing member 135.

The spacer substrate 140 may be attached onto the non-display area NDA of the first display substrate 110 on which the sealing member 135 is applied and onto the upper surface of the flexible circuit substrate 400 on which the sealing member 135 is applied (1150). As described above, the sealing member 135 may extend from the area where the first display substrate 110 and the second display substrate 120 are overlapped with each other to the upper surface of the flexible circuit substrate 400 which is bonded to the first display substrate 110, thereby further stabilizing the spacer substrate 140.

The polarizer 150 may be disposed on the second display substrate 120 and the spacer substrate 140 (1160), thereby completing the display panel unit of the display device according to the invention.

In concluding the detailed description, those skilled in the art will appreciate that many variations and modifications can be made to the exemplary embodiments without substantially departing from the principles of the invention. Therefore, the disclosed exemplary embodiments of the invention are used in a generic and descriptive sense only and not for purposes of limitation.

What is claimed is:

1. A display device comprising:
   a first substrate including:
      a display area in which an image is displayed, and
      a non-display area in which an image is not displayed and a signal line is disposed to transmit or receive an electrical signal to or from the display area of the first substrate;
   a second substrate coupled to the first substrate and exposing the non-display area of the first substrate; and
   a sealing member which is disposed between the first substrate and the second substrate and couples the first substrate and the second substrate to each other,
   wherein the sealing member between the first substrate and the second substrate extends to the exposed non-display area of the first substrate and overlaps the signal line in the exposed non-display area of the first substrate.

2. The display device of claim 1, wherein the extended sealing member disposed overlapping the signal line in the exposed non-display area of the first substrate defines a bar shape or a convex shape provided in plural.

3. The display device of claim 2, further comprising:
   a spacer substrate disposed in the exposed non-display area of the first substrate; and
   a polarizer extended to overlap the second substrate and the spacer substrate,
   wherein an entirety of the polarizer is exposed to outside the display device to define the display device as a frameless display device.

4. The display device of claim 3, wherein the extended sealing member is disposed overlapping the spacer substrate.

5. The display device of claim 4, wherein the sealing member includes an opaque material.

6. The display device of claim 1, further comprising:
   a flexible circuit substrate disposed in the exposed non-display area of the first substrate and electrically connected to the signal line in the exposed non-display area of the first substrate; and
   a driver integrated circuit on the flexible circuit substrate.

7. The display device of claim 1, further comprising:
   a driver integrated circuit disposed in the exposed non-display area of the first substrate and electrically connected to the signal line in the exposed non-display area of the first substrate; and
   a flexible circuit substrate electrically connected to the driver integrated circuit disposed in the exposed non-display area of the first substrate.

8. A display device comprising:
   a first substrate including a display area and a non-display area;
   a second substrate coupled to the first substrate and exposing the non-display area of the first substrate;
   a sealing member which is disposed between the first substrate and the second substrate and couples the first substrate and the second substrate to each other; and
   a flexible circuit substrate electrically connected to the first substrate at the exposed non-display area of the first substrate,
   wherein the sealing member between the first substrate and the second substrate extends to overlap the flexible circuit substrate at the exposed non-display area of the first substrate.

9. The display device of claim 8, wherein a signal line is disposed in the exposed non-display area of the first substrate and transmits or receives an electrical signal to or from the display area of the first substrate.

10. The display device of claim 9, wherein the extended sealing member is disposed overlapping the signal line in the exposed non-display area of the first substrate.

11. The display device of claim 8, wherein the flexible circuit substrate electrically connected to the first substrate at the exposed non-display area of the first substrate includes a driver integrated circuit.

12. The display device of claim 8, wherein in the exposed non-display area of the first substrate,
   a first portion of the extended sealing member does not overlap the flexible circuit substrate and a second portion of the extended sealing member overlaps the flexible circuit substrate, and
   the first portion defines a thickness of the extended sealing member larger than that of the second portion of the extended sealing member.

13. The display device of claim 8, wherein the extended sealing member overlapping the flexible circuit substrate in the exposed non-display area of the first substrate defines a bar shape or a convex shape provided in plural.

14. The display device of claim 13, further comprising:
   a spacer substrate disposed on the non-display area of the first substrate and the flexible circuit substrate; and
   a polarizer disposed on the spacer substrate and the second substrate,
   wherein an entirety of the polarizer is exposed to outside the display device to define the display device as a frameless display device.

15. The display device of claim 14, wherein the extended sealing member is disposed overlapping the spacer substrate.

16. The display device of claim 15, wherein the sealing member includes an opaque material.

17. A method of forming a display device, comprising:
   preparing a first substrate including a display area in which an image is displayed and a non-display area in which a signal line is disposed to transmit or receive an electrical signal to or from the display area of the first substrate;
   disposing a second substrate to face the first substrate and expose the non-display area of the first substrate;
   coupling the first and second substrates to each other by disposing a sealing member between and overlapping the first and second substrates; and
   extending the sealing member disposed overlapping the first and second substrates to the exposed non-display area of the first substrate, wherein the extended sealing member overlaps the signal line in the exposed non-display area of the first substrate.

18. The method of claim 17, further comprising electrically connecting a flexible circuit substrate to the signal line in the exposed non-display area of the first substrate.

19. The method of claim 18, wherein
the extending the sealing member is performed after the electrically connecting the flexible circuit substrate to the signal line in the exposed non-display area of the first substrate, such that the extended sealing member overlaps the signal line and the flexible circuit substrate which is electrically connected to the signal line in the exposed non-display area of the first substrate.

* * * * *